(12) United States Patent
Montgomery et al.

(10) Patent No.: US 11,871,610 B2
(45) Date of Patent: Jan. 9, 2024

(54) DUAL BANK STRUCTURE FOR IMPROVED EXTRACTION FROM AN EMISSIVE LAYER

(71) Applicant: SHARP KABUSHIKI KAISHA, Sakai (JP)

(72) Inventors: David James Montgomery, Bampton (GB); Peter John Roberts, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 350 days.

(21) Appl. No.: 17/320,040

(22) Filed: May 13, 2021

(65) Prior Publication Data

US 2022/0367837 A1    Nov. 17, 2022

(51) Int. Cl.
| | |
|---|---|
| *H10K 50/85* | (2023.01) |
| *H10K 50/856* | (2023.01) |
| *H10K 50/854* | (2023.01) |
| *H10K 50/858* | (2023.01) |
| *H10K 59/122* | (2023.01) |
| *H10K 59/173* | (2023.01) |
| *H10K 50/818* | (2023.01) |

(Continued)

(52) U.S. Cl.
CPC ......... *H10K 50/856* (2023.02); *H10K 50/854* (2023.02); *H10K 50/858* (2023.02); *H10K 59/122* (2023.02); *H10K 59/173* (2023.02); *H10K 50/818* (2023.02); *H10K 50/828* (2023.02); *H10K 2102/3026* (2023.02); *H10K 2102/321* (2023.02)

(58) Field of Classification Search
CPC .. H10K 50/856; H10K 50/854; H10K 50/858; H10K 59/122; H10K 59/173; H10K 50/818; H10K 50/828; H10K 2102/3026; H10K 2102/321
See application file for complete search history.

(56) References Cited

U.S. PATENT DOCUMENTS

| | | |
|---|---|---|
| 7,091,658 B2 | 8/2006 | Ito et al. |
| 7,973,470 B2 | 7/2011 | Cok |

(Continued)

FOREIGN PATENT DOCUMENTS

| | | |
|---|---|---|
| CN | 106876566 A | 6/2017 |
| KR | 1020150020140 A | 2/2015 |

(Continued)

OTHER PUBLICATIONS

Lee et al., "Three Dimensional Pixel Configurations for Optical Outcoupling of OLED Displays—Optical Simulation" Proceedings SID Display Week 2019, published 2019.

*Primary Examiner* — S M Sohel Imtiaz
(74) *Attorney, Agent, or Firm* — ScienBiziP, P.C.

(57) ABSTRACT

A light-emitting structure includes a substrate, a sub-pixel stack over a surface of the substrate, and a bank including a first bank portion and a second bank portion. The sub-pixel stack has an emissive stack including an emissive layer between a first transport layer and a second transport layer, a first electrode layer coupled to the first transport layer, and a second electrode layer coupled to the second transport layer. The second bank portion is between the first bank portion and the sub-pixel stack, and the bank surrounding at least the emissive stack and the first electrode layer forms an interior space above the sub-pixel stack.

13 Claims, 7 Drawing Sheets

(51) Int. Cl.
   *H10K 50/828* (2023.01)
   *H10K 102/00* (2023.01)

(56) References Cited

U.S. PATENT DOCUMENTS

| | | | |
|---|---|---|---|
| 8,894,243 B2 | 11/2014 | Cho et al. | |
| 9,029,843 B2 | 5/2015 | Harada et al. | |
| 9,123,675 B2 | 9/2015 | Kim et al. | |
| 9,583,727 B2 | 2/2017 | Cho et al. | |
| 10,090,489 B2 | 10/2018 | Uchida et al. | |
| 10,886,486 B1 | 1/2021 | Montgomery et al. | |
| 2004/0183436 A1* | 9/2004 | Ito | H10K 59/122 313/506 |
| 2005/0116620 A1* | 6/2005 | Kobayashi | H10K 50/856 313/506 |
| 2006/0158098 A1* | 7/2006 | Raychaudhuri | H10K 50/828 313/506 |
| 2011/0285269 A1* | 11/2011 | Adachi | H10K 50/8428 313/113 |
| 2013/0134403 A1* | 5/2013 | Harada | H10K 50/818 257/43 |
| 2015/0084012 A1* | 3/2015 | Kim | H10K 50/8445 438/26 |
| 2016/0056399 A1* | 2/2016 | Cho | H10K 50/844 257/40 |
| 2016/0356456 A1 | 12/2016 | Mahler et al. | |
| 2019/0319084 A1* | 10/2019 | Chiang | H10K 59/1213 |
| 2020/0295310 A1* | 9/2020 | Moon | H10K 50/865 |
| 2022/0310957 A1* | 9/2022 | Lu | H10K 59/122 |
| 2023/0165094 A1* | 5/2023 | Yan | H10K 59/18 257/89 |

FOREIGN PATENT DOCUMENTS

| | | |
|---|---|---|
| KR | 1020170079645 A | 7/2017 |
| WO | 2017/205174 A1 | 11/2017 |

\* cited by examiner

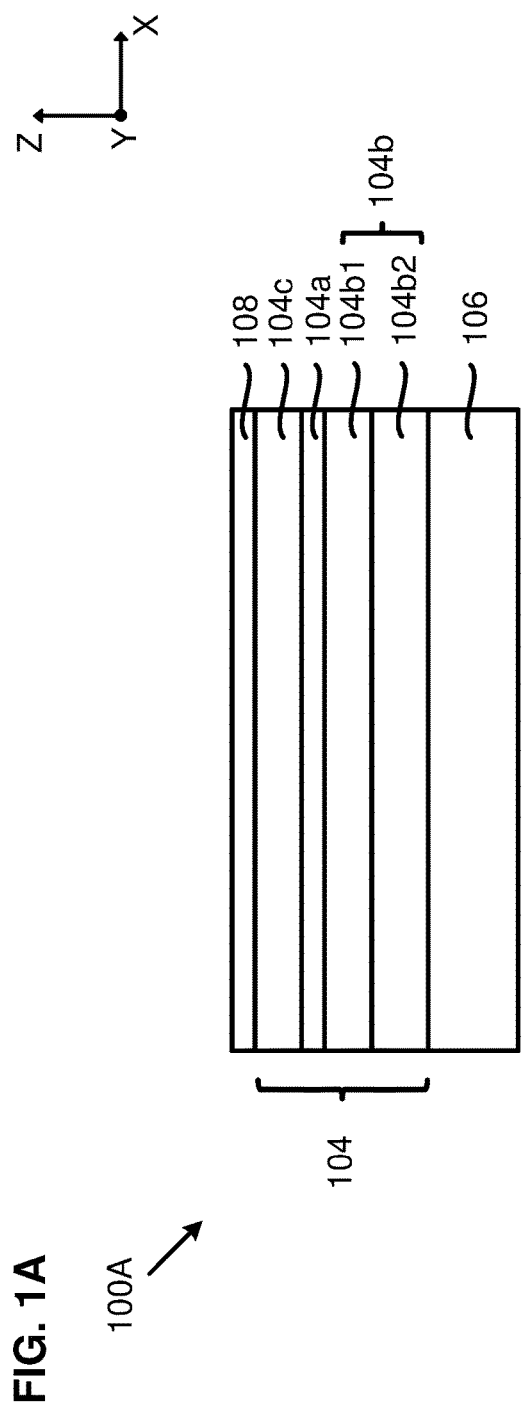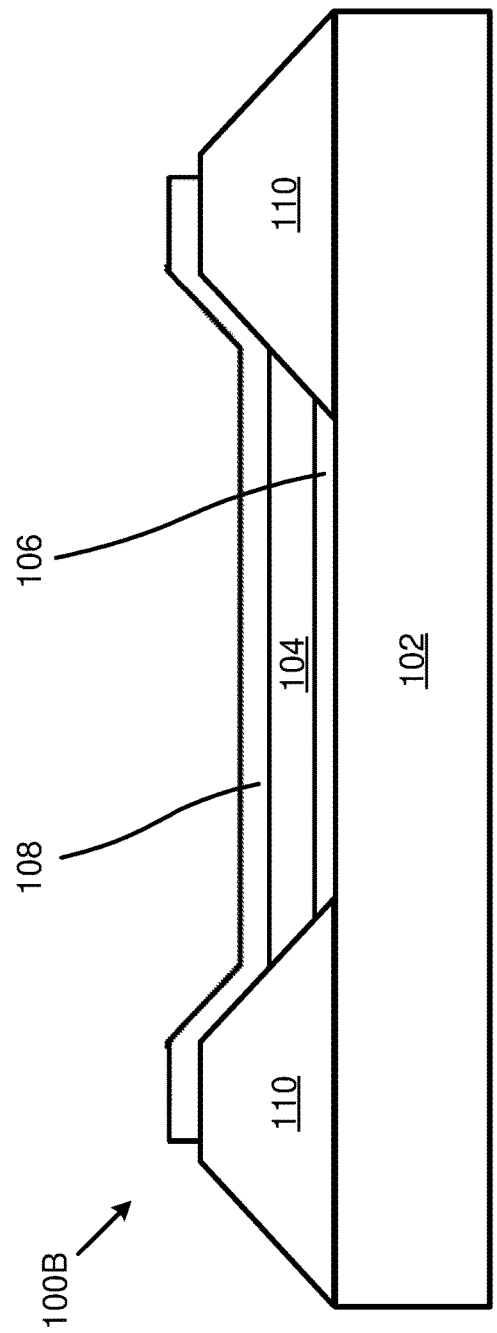

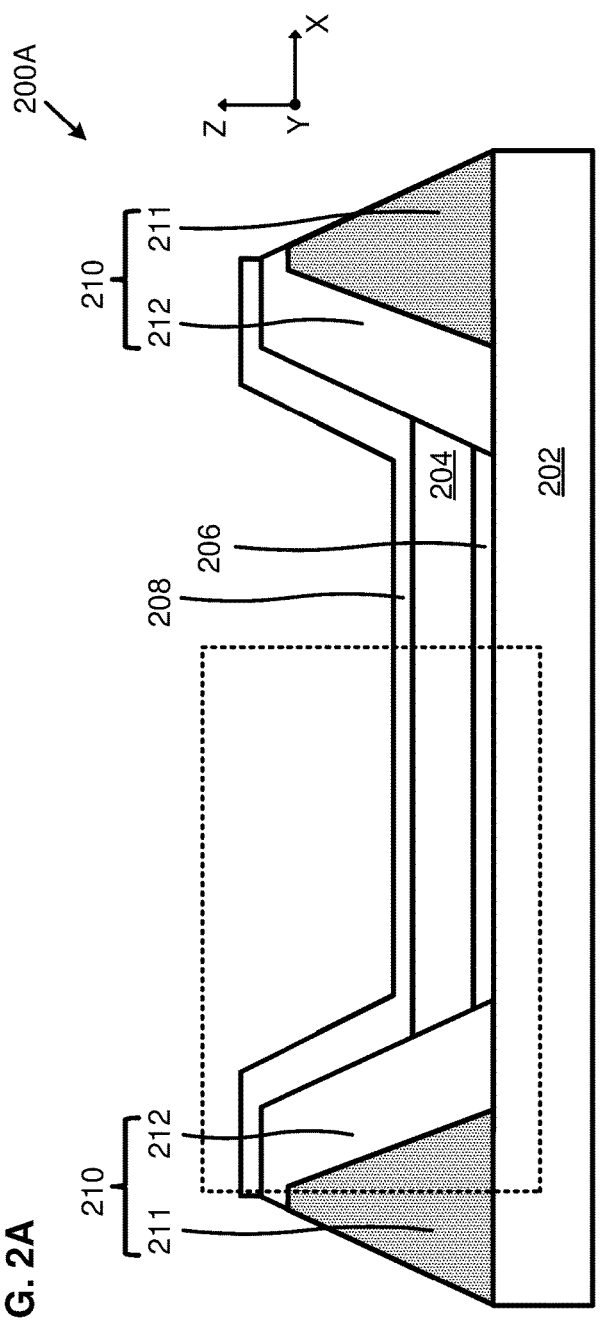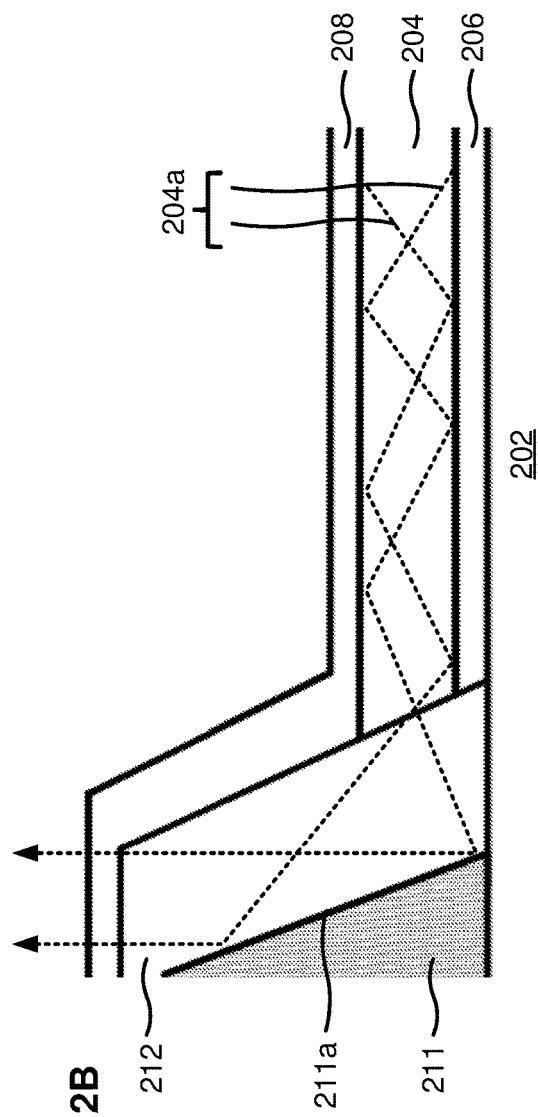

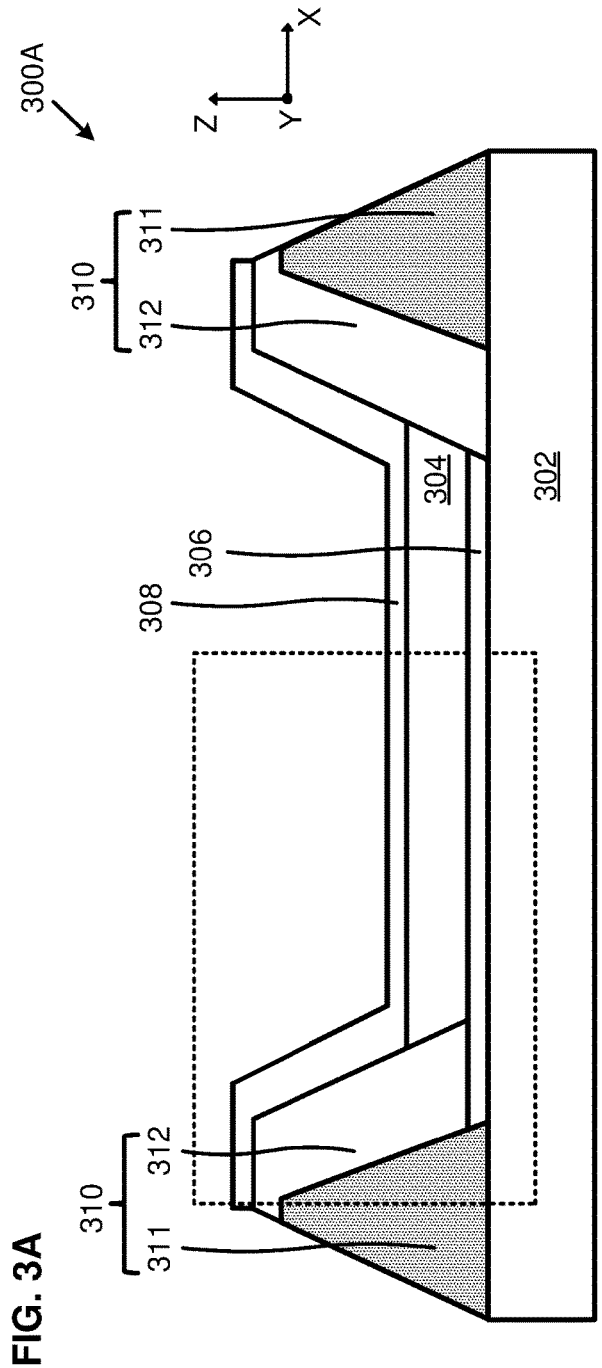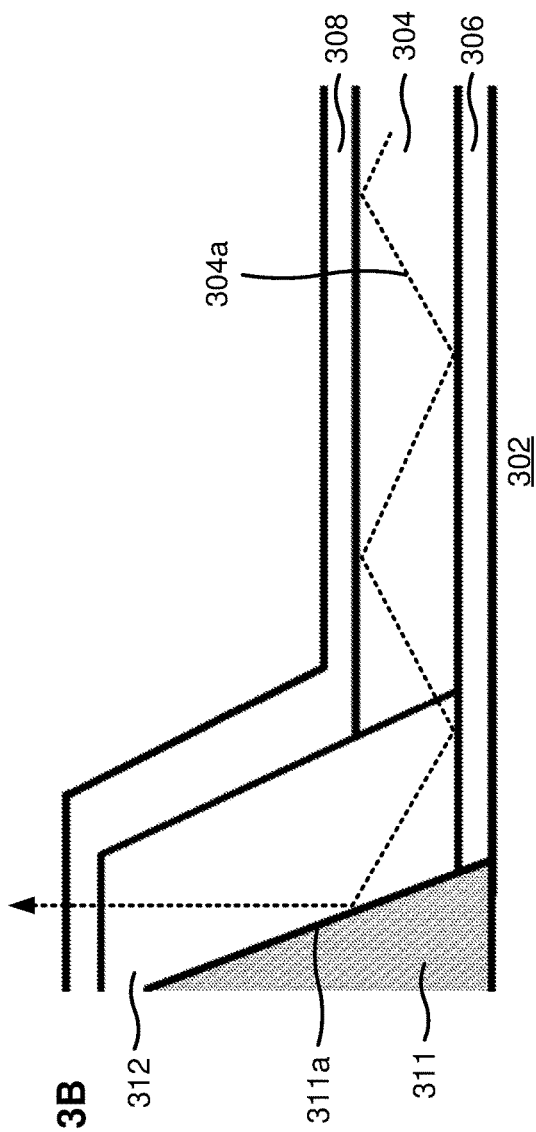

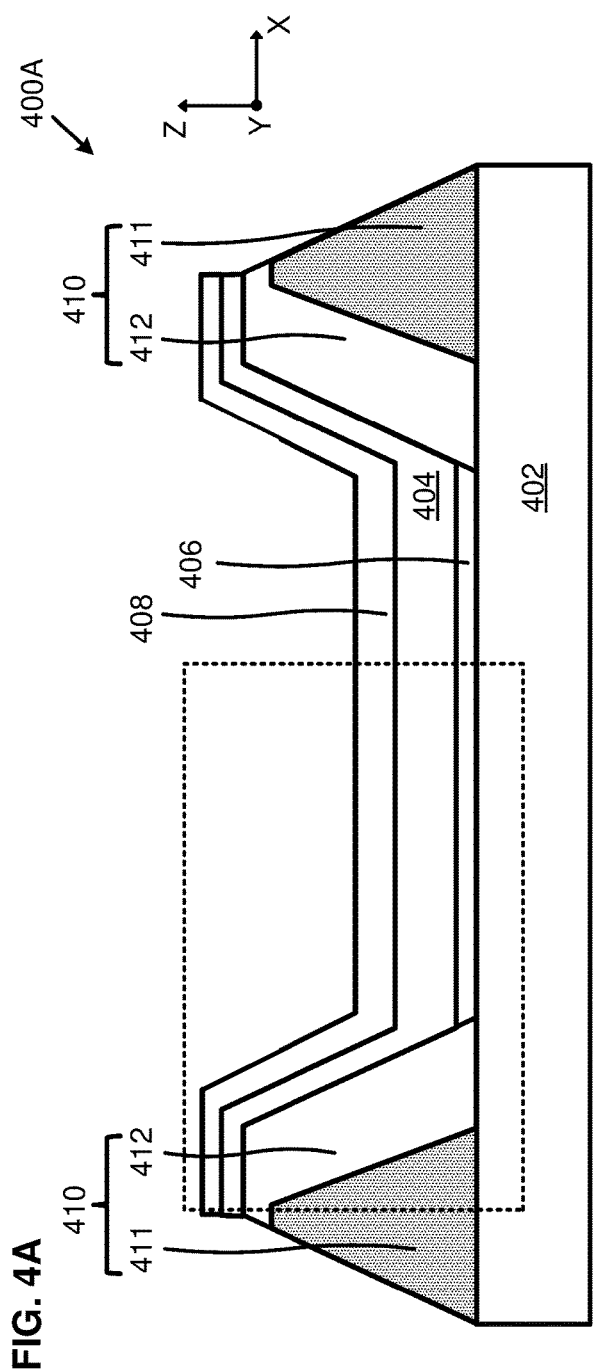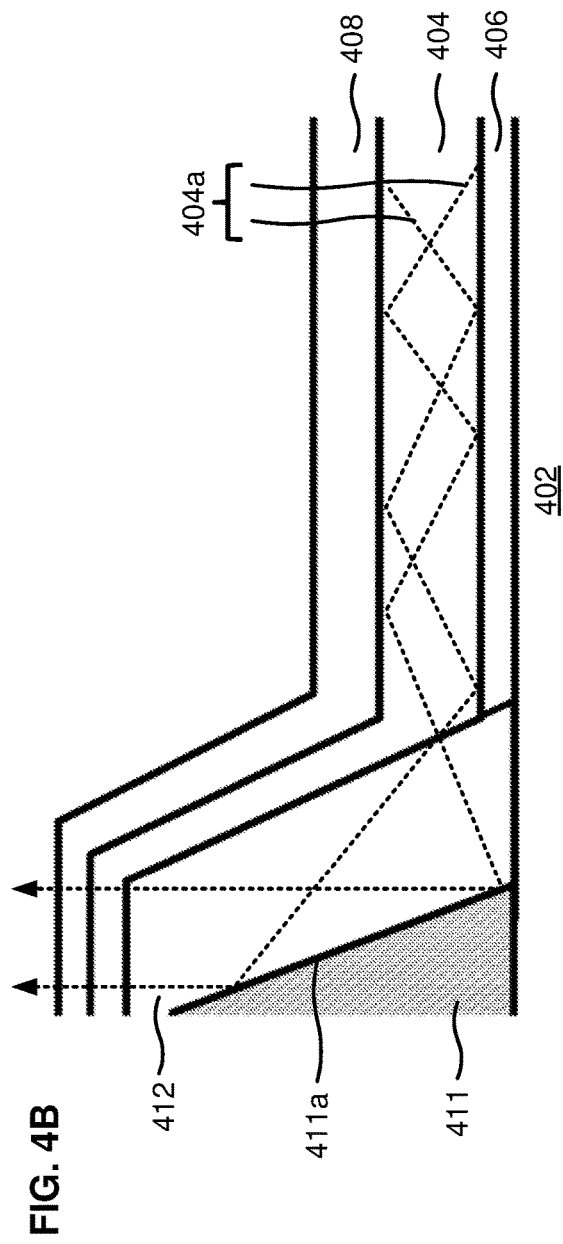
FIG. 4A
FIG. 4B

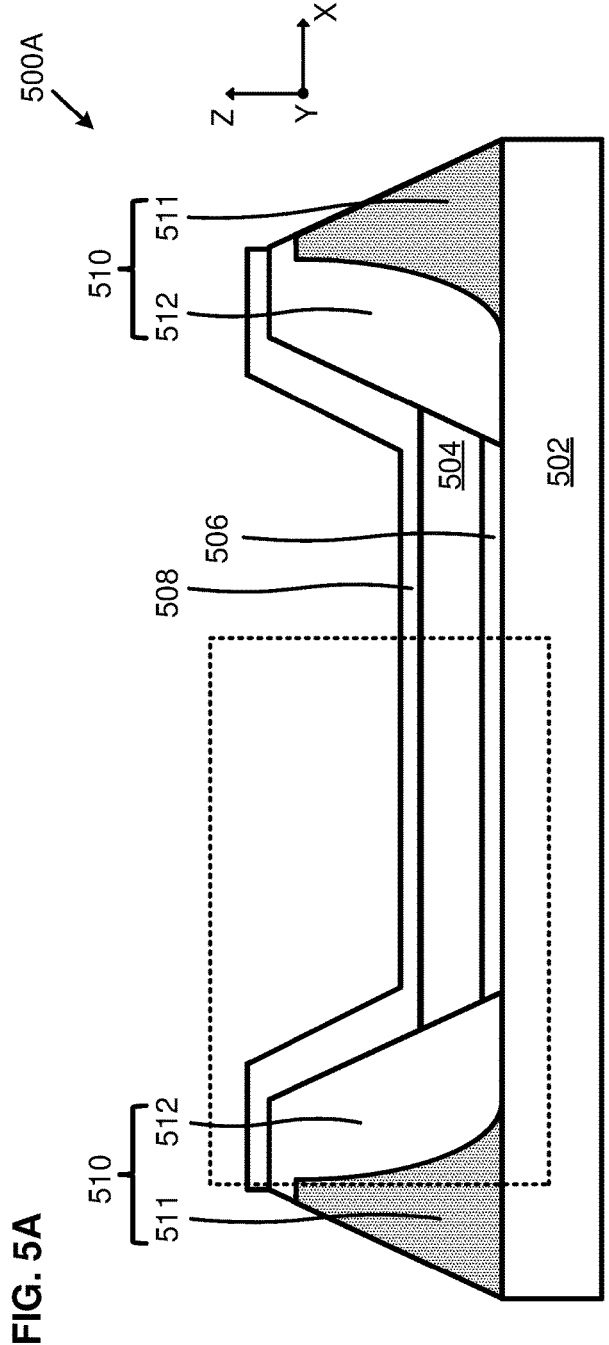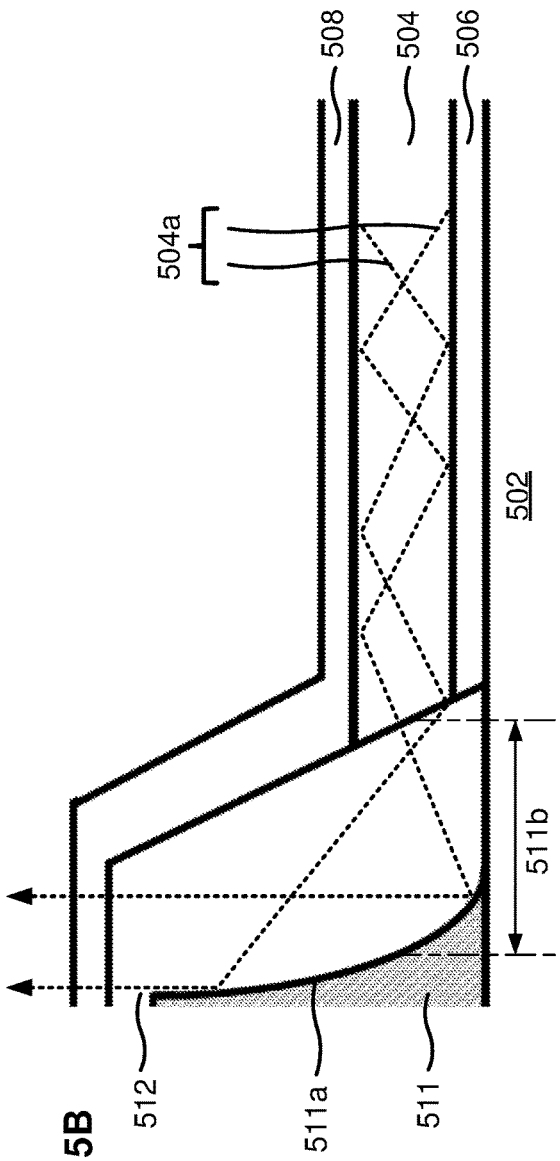
FIG. 5A
FIG. 5B

DUAL BANK STRUCTURE FOR IMPROVED EXTRACTION FROM AN EMISSIVE LAYER

FIELD

The present disclosure is generally related to layers and bank structures used for emissive devices such as Quantum dot Light-Emitting Diode (QLED) displays, Organic Light-Emitting Diode (OLED) displays, and the like. In particular, the present disclosure relates to a top emitting structure surrounded by a bank structure that is configured to redirect light that is typically lost within the structure.

BACKGROUND

An Organic Light Emitting Diode (OLED) is among the most prevalent LEDs used in a display device. QLEDs are proposed as an improvement to OLEDs as they have better spectral emission and are chemically more stable. Quantum dots (QDs) or Quantum dot emissive materials are often used as phosphors for blue LEDs and exist as backlight for Liquid Crystal Displays (LCDs).

In a layered emissive display device, an emissive material (e.g., an organic electroluminescent dye for an OLED and QDs for a QLED) is sandwiched between hole transporting and electron transporting layers and electrodes. This structure operates as a diode, and when current flows, electroluminescence in the emissive material creates light, and one electrode is made partially transmissive to allow light extraction. For OLEDs (and, to a lesser extent, QLEDs), the primary form of energy loss is when the light cannot be extracted from the emitting structure. A typical OLED only extracts approximately 20% of the light created into air. Two key reasons for such a lower percentage of light extraction are that the refractive indices of the layers in the layered emissive display device are generally quite high (e.g., a significant amount of loss by total internal reflection) and a partially reflecting electrode reflects a significant portion of light while an optical thickness of the layers between the electrodes is on the order of a wavelength, so interference is an important factor to be controlled. Furthermore, this interference, being wavelength and angle dependent, creates a shift in colour when viewed at different angles.

The design of the layered emissive structure can be optimized, but there is generally a trade-off between maximizing efficiency and optimizing colour gamut range and colour shift.

SUMMARY

The present disclosure is directed to an emissive display involving a quantum dot emissive material for a QLED or an organic electroluminescent dye for an OLED in an LED arrangement.

In accordance with a first aspect of the present disclosure, a light-emitting structure includes a substrate, a sub-pixel stack over a surface of the substrate, and a bank having a first bank portion and a second bank portion. The sub-pixel stack has an emissive stack including an emissive layer between a first transport layer and a second transport layer, a first electrode layer coupled to the first transport layer, and a second electrode layer coupled to the second transport layer. The second bank portion is between the first bank portion and the sub-pixel stack, and the bank surrounding at least the emissive stack and the first electrode layer forms an interior space above the sub-pixel stack.

In an implementation of the first aspect, the second bank portion separates the first bank portion from the emissive stack such that a portion of light emissions from the emissive stack diverges by the second bank portion and is directed onto at least one surface of the first bank portion.

In another implementation of the first aspect, the first bank portion is opaque and is at least one of light-scattering material and light-reflective material, and the second bank portion is at least one of transparent and semi-transparent.

In yet another implementation of the first aspect, the at least one surface of the first bank portion is at an angle to an axis substantially normal to a top surface of the emissive stack.

In yet another implementation of the first aspect, the diverged light emissions are reflected by the at least one surface of the first bank portion along an on-axis direction substantially normal to the top surface of the emissive stack.

In yet another implementation of the first aspect, the bank has a thickness greater than a thickness of the emissive stack.

In yet another implementation of the first aspect, the first electrode layer extends through the second bank portion to the first bank portion, and the first bank portion surrounds the first electrode layer and the emissive stack.

In yet another implementation of the first aspect, at least one layer of the emissive stack except for the emissive layer extends to cover at least a portion of the bank.

In yet another implementation of the first aspect, the at least one surface of the first bank portion comprises a concave surface.

In yet another implementation of the first aspect, the concave surface has a focal length being a distance between the first bank portion and an edge of the emissive stack.

In yet another implementation of the first aspect, the light-emitting structure further includes at least one microlens covering the first bank portion, and the diverged light emissions are reflected by the at least one surface of the first bank portion as diverging light, and refracted by the at least one microlens along an on-axis direction which is substantially normal to a top surface of the emissive stack.

In yet another implementation of the first aspect, the at least one microlens has a focal length substantially the same as a sum of a distance between the emissive stack and the first bank portion and a distance between the first bank portion and the at least one microlens.

In yet another implementation of the first aspect, the second bank portion includes a plurality of particles scattered in the second bank portion, and the diverged light emissions propagate to the plurality of particles of the second bank portion, wherein at least some of the diverged light emissions are reflected along an off-axis direction at an angle to an on-axis direction which is substantially normal to a top surface of the emissive stack.

In yet another implementation of the first aspect, the emissive layer includes at least one quantum dot emission material, the first transport layer includes a hole transport layer, the second transport layer includes an electron transport layer, the first electrode layer is an anode layer including a metallic reflector for reflecting light emitted from the emissive layer, and the second electrode layer is a cathode layer including a substantially transparent material.

In yet another implementation of the first aspect, the emissive layer includes at least one quantum dot emission material, the first transport layer includes an electron transport layer, the second transport layer includes a hole transport layer, the first electrode layer is a cathode layer having a metallic reflector for reflecting light emitted from the emissive layer, and the second electrode layer is an anode layer having a substantially transparent material.

In yet another implementation of the first aspect, the emissive layer includes at least one organic electroluminescent dye, the first transport layer includes a hole transport layer, the second transport layer includes an electron transport layer, the first electrode layer is an anode layer including a metallic reflector for reflecting light emitted from the emissive layer, and the second electrode layer is a cathode layer including a substantially transparent material.

In yet another implementation of the first aspect, the emissive layer includes at least one organic electroluminescent dye, the first transport layer includes an electron transport layer, the second transport layer includes a hole transport layer, the first electrode layer is a cathode layer having a metallic reflector for reflecting light emitted from the emissive layer, and the second electrode layer is an anode layer having a substantially transparent material.

In accordance with a second aspect of the present disclosure, a light-emitting structure includes a substrate, a sub-pixel stack emitting at least one of a plurality of colours over a surface of the substrate, and a bank including a first bank portion and a second bank portion. The sub-pixel stack has an emissive stack including an emissive layer between a first transport layer and a second transport layer, a first electrode layer coupled to the first transport layer, and a second electrode layer coupled to the second transport layer. The second bank portion is between the first bank portion and the sub-pixel stack, and the bank surrounding at least the emissive stack and the first electrode layer forms an interior space above the sub-pixel stack.

In an implementation of the second aspect, the second bank portion separates the first bank portion from the emissive stack such that a portion of light emissions from the emissive stack diverges by the second bank portion and is directed onto at least one surface of the first bank portion.

In another implementation of the second aspect, the first bank portion is opaque and is at least one of light scattering material and light reflective material, and the second bank portion is at least one of transparent and semi-transparent. The at least one surface of the first bank portion is at an angle to an axis normal to a top surface of the emissive stack. The diverged light emissions are reflected by the at least one surface of the first bank portion along an on-axis direction substantially normal to the top surface of the emissive stack.

In yet another implementation of the second aspect, the light-emitting structure further includes at least one of: the first electrode layer extending through the second bank portion to the first bank portion, wherein the first bank portion surrounds the first electrode layer and the emissive stack; at least one layer of the emissive stack except for the emissive layer extending to cover at least a portion of the bank; and the at least one surface of the first bank portion including a concave surface.

In yet another implementation of the second aspect, the light-emitting structure further includes at least one of: at least one microlens covering the first bank portion, wherein the diverged light emissions are reflected by the at least one surface of the first bank portion as diverging light, and refracted by the at least one microlens along an on-axis direction which is substantially normal to a top surface of the emissive stack; and a plurality of particles scattered in the second bank portion, wherein the diverged light emissions propagate to the plurality of particles of the second bank portion and at least some of the diverged light emissions are reflected along an off-axis direction at an angle to the on-axis direction.

In one or more implementations of the present disclosure, the layers and bank structures may be applicable to a QLED display and an OLED display. However, the emissive layer for a QLED display may include a quantum dot emissive material while the emissive layer for an OLED display may include an organic electroluminescent dye, and the transport layers for a QLED display may include different materials from the transport layers for an OLED display.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 1A illustrates a related art sub-pixel stack in a light emitting structure.

FIG. 1B illustrates another related art sub-pixel stack in a light emitting structure.

FIG. 2A is a schematic cross-sectional view of an example light emitting structure in accordance with an example implementation of the present disclosure.

FIG. 2B is a partially enlarged view of the framed area in FIG. 2A in accordance with an example implementation of the present disclosure.

FIG. 3A is a schematic cross-sectional view of an example light emitting structure in accordance with an example implementation of the present disclosure.

FIG. 3B is a partially enlarged view of the framed area in FIG. 3A in accordance with an example implementation of the present disclosure.

FIG. 4A is a schematic cross-sectional view of an example light emitting structure in accordance with an example implementation of the present disclosure.

FIG. 4B is a partially enlarged view of the framed area in FIG. 4A in accordance with an example implementation of the present disclosure.

FIG. 5A is a schematic cross-sectional view of an example light emitting structure in accordance with an example implementation of the present disclosure.

FIG. 5B is a partially enlarged view of the framed area in FIG. 5A in accordance with an example implementation of the present disclosure.

DESCRIPTION

Figure 6A:
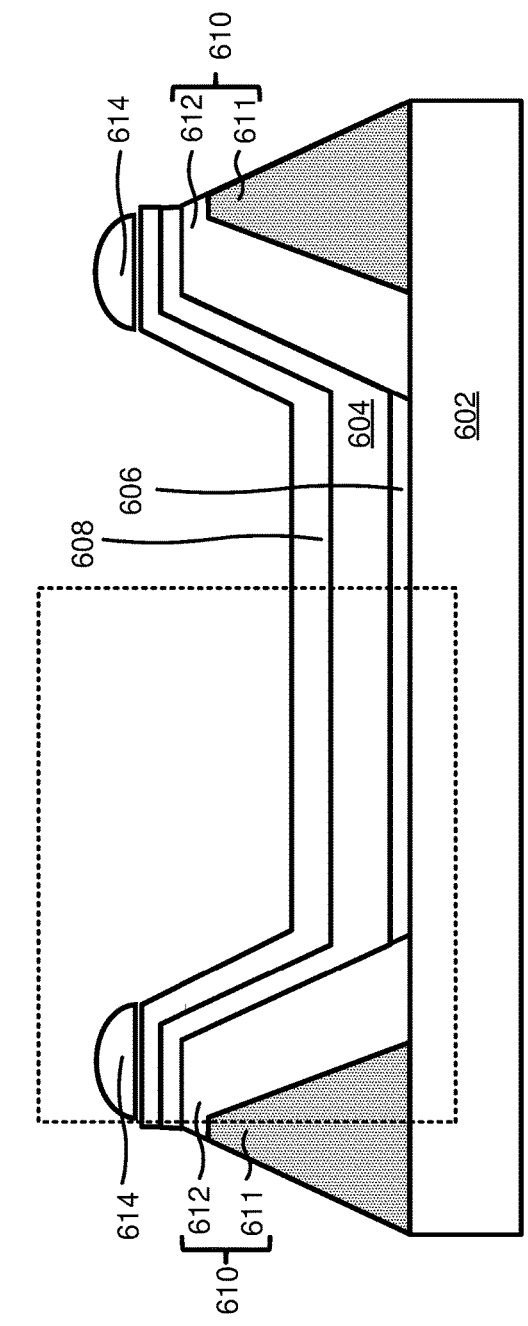
FIG. 6A is a schematic cross-sectional view of an example light emitting structure in accordance with an example implementation of the present disclosure.

The following disclosure contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art.

Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purposes of consistency and ease of understanding, like features may be identified (although, in some examples, not shown) by the same numerals in the example figures. However, the features in different implementations may be different in other respects, and thus shall not be narrowly confined to what is shown in the figures.

The description uses the phrases "in one implementation," or "in some implementations," which may each refer to one or more of the same or different implementations. The term "comprising" means "including, but not necessarily limited to" and specifically indicates open-ended inclusion or membership in the so-described combination, group, series, and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standards, and the like are set forth for providing an understanding of the described technology. In other examples, detailed description of well-known methods, technologies, systems, architectures, and the like are omitted so as not to obscure the description with unnecessary details.

The present disclosure relates to an emissive display involving a quantum dot emissive material for a QLED or an organic electroluminescent dye for an OLED in a light emitting diode (LED) arrangement. Although one or more implementations of the present disclosure are described with reference to displays with QLED pixels, the example implementations provided herein do not limit the scope of the present disclosure and may also be applied in other displays and structures, such as OLED structures. The LED arrangement involving a QLED pixel typically includes a layer of quantum dot emission material (e.g., emissive layer) sandwiched between an electron transport layer (ETL) and a hole transport layer (HTL). The three layers are sandwiched between two conductive layers to form a sub-pixel stack. In one or more implementations of the present disclosure, a "top" emitting (TE) structure is used. The TE structure involves light emission from a side of the TE structure opposite a glass substrate on which the TE structure is disposed.

In one or more implementations of the present disclosure, fabrication of a TE device involves one layer of conductive reflective material, typically made of a thick metal (e.g., silver or aluminium) layer deposited on the glass substrate with the HTL layer on the conductive reflective layer (e.g., a reflective conductor or reflective electrode), the emissive layer on the HTL layer, the ETL layer on the emissive layer, and a transparent electrode layer on the ETL layer. In one preferred implementation, the bottom reflective electrode may have a thickness greater than 80 nm (i.e., $10^{-9}$ meters). In another preferred implementation, the reflective electrode includes a layer of silver having a thickness of approximately 100 nm and a layer of ITO (Indium Tin Oxide) having a thickness of approximately 10 nm. In one preferred implementation, the HTL layer may be made of a layer of PEDOT:PSS (poly(3,4-ethylenedioxythiophene) polystyrene sulfonate) approximately 40 nm thick and a layer of TFB (poly(9,9'-dioctylfluorene-co-bis-N,N'-(4-butylphenyl) diphenylamine)) having a thickness of approximately 35-45 nm on the PEDOT:PSS layer. In one implementation, an ITO layer or an IZO (Indium Zinc Oxide) layer may be located between the reflective electrode and the PEDOT:PSS layer and may have a thickness between 10-200 nm, depending on materials of the other layers and the emission wavelength. In another preferred implementation, an approximately 20 nm thick emissive layer may be disposed on the HTL layer and the ETL layer may be disposed on the emissive layer. In another preferred implementation, the ETL layer may be made of Zinc Oxide (ZnO) nanoparticles and may have a thickness of approximately 30-80 nm. The values of the thicknesses of the layers may vary slightly and may vary depending on the wavelength of emissions. In one preferred implementation, the transparent electrode layer (e.g., a top electrode layer of the TE device) may be a thin metal layer thick enough to carry sufficient current yet thin enough to be transparent to light and disposed on the ETL layer. In one preferred implementation, the transparent top electrode layer is typically made of a thin metal layer, such as silver or magnesium-silver alloy having a thickness of about 10-20 nm. In one implementation, the transparent top electrode layer may be "non-metallic", for example, a layer of ITO. The "non-metallic" transparent electrode may have a thickness of 80-100 nm. In one or more implementations, the ETL layer, the HTL layer, and the emissive layer may be an emissive stack.

The present disclosure is not limited to the provided examples, as the essential principle of the disclosed structure still applies if the arrangement of the ETL and HTL layers is reversed. In one preferred implementation of the present disclosure, the transport layer is thinner than the transport layer disposed closer to the glass substrate regardless of whether the ETL layer or the HTL layer is disposed on the emitting side of the emissive layer away from the glass substrate.

A QLED sub-pixel structure typically includes an interior space structure (e.g., a cavity structure) that may be outlined by a sub-pixel stack having an emissive layer and other layers, and a bank structure surrounding the sub-pixel stack. The interior space structure above the layers within the bank structure may optionally be a filler or an encapsulate material that protects the emissive layer. Light emissions from the emissive layer are generated by recombination of electron-hole pairs, which emit light as an electric dipole, from the HTL and ETL layers. The axes associated with the dipoles of these emissions are random in direction. Since the refractive index of the emissive layer, the HTL layer, and the ETL layer, typically in the range of 1.5 to 1.9, are significantly higher than the refractive index of air, a significant portion of the light emissions from the emissive layer are "trapped" (which may be understood as light confined within the structure by total internal reflection (TIR), in waveguide modes between the electrodes, or in surface plasmon formation) while only a small fraction of the light emissions directed along or near the normal of the layers is extracted to air. In sub-pixel structures where the layers are mostly even in thickness, the trapped emissions may propagate between the electrodes until eventually absorbed by the electrodes.

In related art, for QLED and OLED displays that include metallic top transparent electrodes, the light emission losses limit the most effective displays to approximately 20% optical extraction. For QLEDs that may use non-metallic top transparent electrodes, a higher optical extraction may be achievable. However, a 40-50% loss may still be expected in such modes, especially if the transparent electrode has a lower refractive index than the refractive indices of the other layers of the sub-pixel structure in the display.

The present disclosure seeks to improve light extraction by utilising the dual bank structure to help extraction of the trapped light emissions that propagate within the emissive layers. In addition, the extracted light emissions may be collimated to improve light extraction efficiency, which could translate to a higher on-axis brightness for a given power in fixed displays, such as televisions, or a given brightness for lower power displays, such as mobile displays.

The example implementations of the present disclosure may be related to QLED structures. However, the present disclosure is not limited only to QLED structures and may be applicable to various implementations related to OLED structures.

FIG. 1A illustrates a related art sub-pixel stack in a light emitting structure. FIG. 1B illustrates another related art sub-pixel stack in a light emitting structure.

In FIG. 1A, the related art sub-pixel stack 100A of a light emitting structure (not explicitly shown) may be a top emitting (TE) light emitting structure, which refers to light emissions that are emitted through a top electrode of the sub-pixel stack rather than a glass substrate (not explicitly shown). The sub-pixel stack 100A may include an emissive layer 104a, an HTL layer 104b, an ETL layer 104c, a first electrode layer 106, and a second electrode layer 108. The emissive layer 104a between and cooperative with the HTL layer 104b and the ETL layer 104c, for example, may be an emissive stack 104. The HTL layer 104b may include a PEDOT:PSS layer 104b1 and a layer of TFB 104b2. The first electrode layer 106 may be disposed on the glass substrate. The emissive stack 104 may be disposed on the first electrode layer 106 and the second electrode layer 108 may be disposed on the emissive stack 104. The first electrode layer 106 may be a reflective bottom electrode layer and the second electrode layer 108 may be a transparent top electrode layer.

In FIG. 1B, a related art light emitting structure 100B may include a glass substrate 102, a related art sub-pixel stack (e.g., emissive stack 104, first electrode layer 106, and second electrode layer 108 in FIG. 1A) on the glass substrate 102, and a bank 110. The sub-pixel stack may include a first electrode layer 106 on the glass substrate 102, an emissive stack 104 having an emissive layer, an HTL layer, and an ETL layer (not explicitly shown but similar to the emissive layer 104a, the HTL layer 104b, and the ETL layer 104c in FIG. 1A) on the first electrode layer 106, and a second electrode layer 108 on the emissive stack 104. The bank 110 may have a sloped sidewall that surrounds the first electrode layer 106 and the emissive stack 104 to form an interior space (not explicitly shown) above the sub-pixel stack. The second electrode layer 108 may extend to cover a portion of the bank 110. The emissive stack 104 in FIG. 1B may be substantially the same in function as the emissive stack 104 in sub-pixel stack 100A of FIG. 1A. The first electrode layer 106 may be a reflective bottom electrode layer and the second electrode layer 108 may be a transparent top electrode layer. In some related art light emitting structures, a filler or an encapsulating material may be optionally added to protect the sub-pixel stack. The bank 110 may be opaque where a surface of the bank 110 may be light scattering and/or specular reflective. The bank 110 may be coated with a high reflectivity material and the second electrode layer 108 may extend to cover a portion of the emissive stack 104 to further extract light. The bank 110 maybe half a micron in thickness or greater.

FIG. 2A is a schematic cross-sectional view of an example light emitting structure in accordance with an example implementation of the present disclosure. FIG. 2B is a partially enlarged view of the framed area in FIG. 2A in accordance with an example implementation of the present disclosure.

In FIG. 2A, an example light emitting structure 200A may include a substrate 202, a first electrode layer 206 on the substrate 202, an emissive stack 204 on the first electrode layer 206, and a second electrode layer 208 on the emissive stack 204. Further included in the light emitting structure 200A may be a bank 210 surrounding the first electrode layer 206 and the emissive stack 204 to form an interior space above the sub-pixel stack (the first electrode layer 206, emissive stack 204, and second electrode layer 208). The second electrode layer 208 may extend over a portion of the bank 210. In one implementation of the present disclosure, the second electrode layer 208 may extend to cover the entire bank 210. In one or more implementations of the present disclosure, the emissive stack 204, the first electrode layer 206, and the second electrode layer 208 may be a sub-pixel stack on the substrate 202, and the emissive stack 204 may include an emissive layer between an HTL layer and a ETL layer (not explicitly shown), as described in the disclosure.

In one or more implementations of the present disclosure, the bank 210 may include a first bank portion 211 and a second bank portion 212 (e.g., a dual bank structure). The second bank portion 212 may be located between the first bank portion 211 and the emissive stack 204 to provide a separating distance between the first bank portion 211 and the emissive stack 204. In one of more implementations of the present disclosure, the bank 210 may be greater in thickness (e.g., along the z-direction, as indicated in FIG. 2A) than the thickness of the emissive stack 204. In one or more implementations, the bank 210 may have a thickness of half a micron or greater. In one implementation, the bank 210 may have a thickness of 2-3 microns. In one or more implementations, the first bank portion 211 may be opaque and may include at least one of light-scattering material and light-reflective material, and the second bank portion 212 may be transparent, semi-transparent, or a combination thereof. In one implementation, the light-scattering material or the light-reflective material may be silver. In one or more implementations, the second bank portion 212 may have a refractive index relatively close to a refractive index of the emissive stack 204. In one preferred implementation, the refractive index of the second bank portion 212 (e.g., approximately 1.5 or 1.6) may be slightly less than the refractive index of the emissive layer 204.

FIG. 2B is a partially enlarged view of the framed area in FIG. 2A in accordance with an example implementation of the present disclosure. In FIG. 2B, the first bank portion 211 may include at least one surface 211a at an angle with respect to an axis substantially normal to a top surface of the emissive stack 204. In FIG. 2B, the second bank portion 212 may be positioned between the first bank portion 211 and the emissive stack 204 to provide a separating distance between the first bank portion 211 and the emissive stack 204. In one or more implementations, the separating distance may be approximately equal to a height of the bank structure (e.g., bank 210), but are not limited to the examples presented herein. The separating distance may allow a portion of light emissions 204a emitted from the emissive stack 204 and trapped in the emissive stack 204 by the first electrode layer 206 and the second electrode layer 208 to propagate within the emissive stack 204 over a course of a few microns, and then diverge within the second bank portion 212. The diverged light 204a may then encounter the at least one surface 211a of the first bank portion 211 such that the diverged light 204a may be reflected by the at least one surface 211a of the first bank portion 211 along an on-axis direction substantially normal to the top surface of the emissive stack 204. With the light emitting structure 200A including the dual bank structure, which has the first bank portion 211 (e.g., an opaque and reflective portion) and the second bank portion 212 (e.g., a transparent portion) between the first bank portion 211 and the emissive stack 204, a greater part of the light trapped within the emissive stack 204 may diverge and propagate through the second bank portion 212 to reach a greater part of the first bank portion 211 and be reflected in the on-axis direction. As such, light extraction may be improved, and the light extracted may be further collimated to improve efficiency, resulting in a higher on-axis brightness for a display.

FIG. 3A is a schematic cross-sectional view of an example light emitting structure in accordance with an example implementation of the present disclosure. FIG. 3B is a partially enlarged view of the framed area in FIG. 3A in accordance with an example implementation of the present disclosure.

In FIG. 3A, the example light emitting structure 300A may be substantially similar to the example light emitting structure 200A in FIG. 2A. The example light emitting structure 300A in FIG. 3A may include a substrate 302, a first electrode layer 306 on the substrate 302, an emissive stack 304 on the first electrode layer 306, and a second electrode layer 308 on the emissive stack 304. Further included in the light emitting structure 300A may be a bank 310 surrounding the first electrode layer 306 and the emissive stack 304 to form an interior space above the sub-pixel stack (e.g., the first electrode layer 306, emissive stack 304, and second electrode layer 308). The second electrode layer 308 may extend over a portion of the bank 310. In one implementation of the present disclosure, the second electrode layer 308 may extend to cover the entire bank 310. In one or more implementations of the present disclosure, the emissive stack 304, the first electrode layer 306, and the second electrode layer 308 may be a sub-pixel stack on the substrate 302, and the emissive stack 304 may include an emissive layer between an HTL layer and a ETL layer (not explicitly shown), as described in the disclosure.

In one or more implementations of the present disclosure, the bank 310 may include a first bank portion 311 and a second bank portion 312 (e.g., a dual bank structure). The second bank portion 312 may be located between the first bank portion 311 and the emissive stack 304 to provide a separating distance between the first bank portion 311 and the emissive stack 304. In one of more implementations of the present disclosure, the bank 310 may be greater in thickness (e.g., along the z-direction, as indicated in FIG. 3A) than the thickness of the emissive stack 304. In one or more implementation, the bank 310 may have a thickness of half a micron or greater. In one implementation, the bank 310 may have a thickness of 2-3 microns. In one or more implementations, the first bank portion 311 may be opaque and may include at least one of light-scattering material and light-reflective material, and the second bank portion 312 may be transparent, semi-transparent, or a combination thereof. In one implementation, the light-scattering material or the light-reflective material may be silver.

The example light emitting structure 300A in FIG. 3A of the present disclosure may differ from the example light emitting structure 200A in FIG. 2A in that the structure 300A may include the first electrode layer 306 extending into the second bank portion 312.

FIG. 3B is a partially enlarged view of the framed area in FIG. 3A in accordance with an example implementation of the present disclosure. In FIG. 3B, the first bank portion 311 may include at least one surface 311a at an angle with respect to an axis substantially normal to a top surface of the emissive stack 304. The second bank portion 312 may be located between the first bank portion 311 and the emissive stack 304 to provide a separating distance between the first bank portion 311 and the emissive stack 304. The separating distance may allow a portion of light emissions 304a emitted from the emissive stack 304 and trapped in the emissive stack 304 by the first electrode layer 306 and the second electrode layer 308 to propagate within the emissive stack 304 over a course of a few microns. The first electrode layer 306 extended into the second bank portion 312 may reflect (or transmit) even more of the trapped light emissions 304a within the emissive stack 304 towards the at least one surface 311a. The reflected light emissions 304a may further diverge within the second bank portion 312 and be directed onto the at least one surface 311a of the first bank portion 311, such that the diverged light 304a may be reflected by the at least one surface 311a of the first bank portion 311 along an on-axis direction substantially normal to the top surface of the emissive stack 304. With the light emitting structure 300A including the dual bank structure, which has the first bank portion 311 (e.g., an opaque and reflective portion) and the second bank portion 312 (e.g., a transparent portion) between the first bank portion 311 and the emissive stack 304, a greater part of the light trapped within the emissive stack 304 may diverge and propagate through the second bank portion 312 of the dual bank structure to reach a greater part of the first bank portion 311 and be reflected in the on-axis direction. Furthermore, the example light emitting structure 300A having the extended first electrode layer 306 into the second bank portion 312 may allow even more of the trapped light from within the emissive stack 304 be reflected by the extended first electrode layer 306 towards the at least one surface 311a of the first bank portion 311 and be collimated, as opposed to a light emitting structure without the extended first electrode layer 306. As such, light extraction may be further improved, and the extracted light may be further collimated to improve efficiency, resulting in a higher on-axis brightness for a display.

FIG. 4A is a schematic cross-sectional view of an example light emitting structure in accordance with an example implementation of the present disclosure. FIG. 4B is a partially enlarged view of the framed area in FIG. 4A in accordance with an example implementation of the present disclosure.

In FIG. 4A, the example light emitting structure 400A may be substantially similar to the example light emitting structure 200A in FIG. 2A. The example light emitting structure 400A in FIG. 4A may include a substrate 402, a first electrode layer 406 on the substrate 402, an emissive stack 404 on the first electrode layer 406, and a second electrode layer 408 on the emissive stack 404. Further included in the light emitting structure 400A may be a bank 410 surrounding the first electrode layer 406 and the emissive stack 404 to form an interior space above the sub-pixel stack (e.g., first electrode layer 406, emissive stack 404, and second electrode layer 408). The second electrode layer 408 may extend over a portion of the bank 410. In one implementation of the present disclosure, the second electrode layer 408 may extend to cover the entire bank 410. In one or more implementations of the present disclosure, the emissive stack 404, the first electrode layer 406, and the second electrode layer 408 may be a sub-pixel stack on the substrate 402, and the emissive stack 404 may include an emissive layer between an HTL layer and a ETL layer (not explicitly shown) as described in the disclosure.

In one or more implementations of the present disclosure, the bank 410 may include a first bank portion 411 and a second bank portion 412 (e.g., a dual bank structure). The second bank portion 412 may be located between the first bank portion 411 and the emissive stack 404 to provide a separating distance between the first bank portion 411 and the emissive stack 404. In one of more implementations of the present disclosure, the bank 410 may be greater in thickness (e.g., along the z-direction, as indicated in FIG. 4A) than the thickness of the emissive stack 404. In one or more implementation, the bank 410 may have a thickness of half a micron or greater. In one implementation, the bank 410 may have a thickness of 2-3 microns. In one or more implementations, the first bank portion 411 may be opaque and may include at least one of light-scattering material and light-reflective material, and the second bank portion 412 may be transparent, semi-transparent, or a combination thereof. In one implementation, the light-scattering material or the light-reflective material may be silver.

The example light emitting structure 400A in FIG. 4A of the present disclosure may differ from the example light emitting structure 200A in FIG. 2A in that the structure 400A may include the emissive stack 404 extending over at least a portion of the bank 410. In one preferred implementation, any one of the multiple layers (e.g., HTL layer, ETL layer, etc.) within the emissive stack 404 except for the emissive layer may extend over at least a portion of the bank 412. In one or more implementations, any one of the multiple layers within the emissive stack 404 except for the emissive layer may extend over the first bank portion 411 and the second bank portion 412.

FIG. 4B is a partially enlarged view of the framed area in FIG. 4A in accordance with an example implementation of the present disclosure. In FIG. 4B, the first bank portion 411 may include at least one surface 411a at an angle with respect to an axis substantially normal to a top surface of the emissive stack 404. The second bank portion 412 may be located between the first bank portion 411 and the emissive stack 404 to provide a separating distance between the first bank portion 411 and the emissive stack 404. The separating distance may allow a portion of light emissions 404a emitted from the emissive stack 404 and trapped in the emissive stack 404 by the first electrode layer 406 and the second electrode layer 408 to propagate within the emissive stack 404 over a course of a few microns. The trapped light emissions 404a may further diverge within the second bank portion 412 and be directed onto the at least one surface 411a of the first bank portion 411 such that the diverged light 404a may be reflected by the at least one surface 411a of the first bank portion 411 along an on-axis direction substantially normal to the top surface of the emissive stack 404. With the light emitting structure 400A including the dual bank structure, which has the first bank portion 411 (e.g., an opaque and reflective portion) and the second bank portion 412 (e.g., a transparent portion) between the first bank portion 411 and the emissive stack 404, a greater part of the light trapped within the emissive stack 404 may diverge and propagate through the second bank portion 412 of the dual bank structure to reach a greater part of the first bank portion 411 and be reflected in the on-axis direction. Furthermore, the example light emitting structure 400A may have any one of the multiple layers within the emissive stack 404 except for the emissive layer extending over at least a portion of the bank 412. As such, light extraction may be improved, and the extracted light may be collimated to improve efficiency, resulting in a higher on-axis brightness for a display. In addition, by allowing one or more layers of light emitting structure 400A to be the same across some or all pixels, those layers may be deposited simultaneously. In such implementations, the light emitting structure 400A, as well as others described below, may require fewer mask steps or inkjet processes, thus resulting in a simpler and less expensive manufacturing process.

FIG. 5A is a schematic cross-sectional view of an example light emitting structure in accordance with an example implementation of the present disclosure. FIG. 5B is a partially enlarged view of the framed area in FIG. 5A in accordance with an example implementation of the present disclosure.

In FIG. 5A, the example light emitting structure 500A may be substantially similar to the example light emitting structure 200A in FIG. 2A. The example light emitting structure 500A in FIG. 5A may include a substrate 502, a first electrode layer 506 on the substrate 502, an emissive stack 504 on the first electrode layer 506, and a second electrode layer 508 on the emissive stack 504. The light emitting structure 500A may also include a bank 510 surrounding the first electrode layer 506 and the emissive stack 504 to form an interior space above the sub-pixel stack (e.g., first electrode layer 506, emissive stack 504, and second electrode layer 508). The second electrode layer 508 may extend over a portion of the bank 510. In one implementation of the present disclosure, the second electrode layer 508 may extend to cover the entire bank 510. In one or more implementations of the present disclosure, the emissive stack 504, the first electrode layer 506, and the second electrode layer 508 may be a sub-pixel stack on the substrate 502, and the emissive stack 504 may include an emissive layer between an HTL layer and a ETL layer (not explicitly shown) as described in the disclosure.

In one or more implementations of the present disclosure, the bank 510 may include a first bank portion 511 and a second bank portion 512 (e.g., a dual bank structure). The second bank portion 512 may be located between the first bank portion 511 and the emissive stack 504 to provide a separating distance between the first bank portion 511 and the emissive stack 504. In one of more implementations of the present disclosure, the bank 510 may be greater in thickness (e.g., along the z-direction, as indicated in FIG. 5A) than the thickness of the emissive stack 504. In one or more implementation, the bank 510 may have a thickness of half a micron or greater. In one implementation, the bank 510 may have a thickness of 2-3 microns. In one or more implementations, the first bank portion 511 may be opaque and may include at least one of light-scattering material and light-reflective material, and the second bank portion 512 may be transparent, semi-transparent, or a combination thereof. In one implementation, the light-scattering material or the light-reflective material may be silver.

The example light emitting structure 500A in FIG. 5A of the present disclosure may differ from the example light emitting structure 200A in FIG. 2A in that the structure 500A may include the first bank portion 511 having at least a concave surface facing the emissive stack 504.

FIG. 5B is a partially enlarged view of the framed area in FIG. 5A in accordance with an example implementation of the present disclosure. In FIG. 5B, the first bank portion 511 may include at least one surface 511a at an angle with respect to an axis substantially normal to a top surface of the emissive stack 504. In one or more implementations of the present disclosure, the at least one surface 511a of the first bank portion 511 may be a concave surface facing the emissive stack 504. In one implementation, the concave surface may be a curved mirror. In one or more implementations, the concave surface 511a may have a focal length 511b approximately equal to a distance between the first bank portion 511 (e.g., the concave surface 511a) and an edge of the emissive stack 504. The second bank portion 512 may be located between the first bank portion 511 and the emissive stack 504 to provide a separating distance between the first bank portion 511 and the emissive stack 504. The separating distance may allow a portion of light emissions 504a emitted from the emissive stack 504 and trapped in the emissive stack 504 by the first electrode layer 506 and the second electrode layer 508 to propagate within the emissive stack 504 over a course of a few microns. The trapped light emissions 504a may further diverge within the second bank portion 512 and be directed onto the concave surface 511a of the first bank portion 511 such that the diverged light 504a may be reflected by the concave surface 511a of the first bank portion 511 along an on-axis direction substantially normal to the top surface of the emissive stack 504. With the light emitting structure 500A including the dual bank structure, which has the first bank portion 511 (e.g., an opaque and reflective portion) and the second bank portion 512 (e.g., a transparent portion) between the first bank portion 511 and the emissive stack 504, a greater part of the light trapped within the emissive stack 504 may diverge and propagate through the second bank portion 512 of the dual bank structure to reach a greater part of the first bank portion 511 and be reflected in the on-axis direction. Furthermore, the concave surface 511a may allow even more light to be collimated in the on-axis direction. As such, light extraction may be further improved, and the extracted light may be better collimated to improve efficiency as compared to the other example light emitting structures in the present disclosure, resulting in a higher on-axis brightness for a display.

Figure 6B:
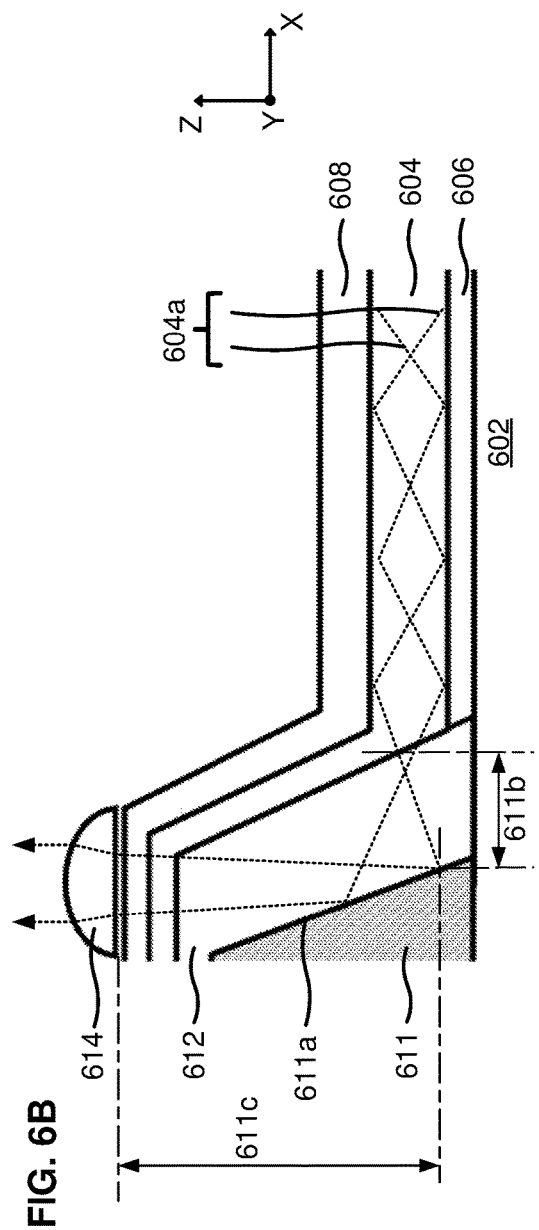
FIG. 6B is a partially enlarged view of the framed area in FIG. 6A in accordance with an example implementation of the present disclosure.

FIG. 6A is a schematic cross-sectional view of an example light emitting structure in accordance with an example implementation of the present disclosure. FIG. 6B is a partially enlarged view of the framed area in FIG. 6A in accordance with an example implementation of the present disclosure.

In FIG. 6A, the example light emitting structure 600A may be substantially similar to the example light emitting structure 400A in FIG. 4A. The example light emitting structure 600A in FIG. 6A may include a substrate 602, a first electrode layer 606 on the substrate 602, an emissive stack 604 on the first electrode layer 606, and a second electrode layer 608 on the emissive stack 604. The light emitting structure 600A may also include a bank 610 surrounding the first electrode layer 606 and the emissive stack 604 to form an interior space above the sub-pixel stack (e.g., first electrode layer 606, emissive stack 604, and second electrode layer 608). The second electrode layer 608 may extend over a portion of the bank 610. In one implementation of the present disclosure, the second electrode layer 608 may extend to cover the entire bank 610. In one or more implementations of the present disclosure, the emissive stack 604, the first electrode layer 606, and the second electrode layer 608 may be a sub-pixel stack on the substrate 602, and the emissive stack 604 may include an emissive layer between an HTL layer and a ETL layer (not explicitly shown) as described in the disclosure.

In one or more implementations of the present disclosure, the bank 610 may include a first bank portion 611 and a second bank portion 612 (e.g., a dual bank structure). The second bank portion 612 may be located between the first bank portion 611 and the emissive stack 604 to provide a separating distance between the first bank portion 611 and the emissive stack 604. In one of more implementations of the present disclosure, the bank 610 may be greater in thickness (e.g., along the z-direction, as indicated in FIG. 6A) than the thickness of the emissive stack 604. In one or more implementation, the bank 610 may have a thickness of half a micron or greater. In one implementation, the bank 610 may have a thickness of 2-3 microns. In one or more implementations, the first bank portion 611 may be opaque and may include at least one of light-scattering material and light-reflective material, and the second bank portion 612 may be transparent, semi-transparent, or a combination thereof. In one implementation, the light-scattering material or the light-reflective material may be silver.

The example light emitting structure 600A in FIG. 6A of the present disclosure may differ from the example light emitting structure 400A in FIG. 4A in that the example light emitting structure 600A may further include at least one microlens 614 over the first bank portion 611. The example light emitting structure 600A may still include the emissive stack 604 extending over at least a portion of the bank 610. In one preferred implementation, any one of the multiple layers (e.g., HTL layer, ETL layer, etc.) within the emissive stack 604 except for the emissive layer may extend over at least a portion of the bank 612. In one or more implementations, any one of the multiple layers within the emissive stack 604 except for the emissive layer may extend over the first bank portion 611 and the second bank portion 612.

FIG. 6B is a partially enlarged view of the framed area in FIG. 6A in accordance with an example implementation of the present disclosure. In FIG. 6B, the first bank portion 611 may include at least one surface 611a at an angle with respect to an axis substantially normal to a top surface of the emissive stack 604. The second bank portion 612 may be located between the first bank portion 611 and the emissive stack 604 to provide a separating distance between the first bank portion 611 and the emissive stack 604. The separating distance may allow a portion of light emissions 604a emitted from the emissive stack 604 and trapped in the emissive stack 604 by the first electrode layer 606 and the second electrode layer 608 to propagate within the emissive stack 604 over a course of a few microns. The trapped light emissions 604a may diverge within the second bank portion 612 and be directed onto the at least one surface 611a of the first bank portion 611. The diverged light 604a may be reflected by the at least one surface 611a of the first bank portion 611 as diverged light and be refracted by the at least one microlens 614 along an on-axis direction which is substantially normal to a top surface of the emissive stack 604. In one or more implementations, the at least one microlens 614 may have a focal length substantially equal to a sum of a relative distance 611b between the emissive stack 604 and the first bank portion 611 and a relative distance 611c between the first bank portion 611 and the at least one microlens 614. For the focal length of the microlens 614, in one or more implementations of the present disclosure, the first bank portion 611 may have a bank angle of approximately 45° with respect to a top surface of the substrate 602 where the bank 610 may be disposed on, and the light-emission distribution from the emissive stack 604 may be directed approximately to a lower portion of the first bank portion 611. In another implementation, the focal length of the microlens 614 may be slightly less relative to the other implementations due to the light-emission distribution from the emissive stack 604 being directed to a higher portion of the first bank portion 611, resulting in the bank angle being greater than 45° to direct light emissions towards the microlens 614.

With the light emitting structure 600A including the dual bank structure, which has the first bank portion 611 (e.g., an opaque and reflective portion) and the second bank portion 612 (e.g., a transparent portion) between the first bank portion 611 and the emissive stack 604, a greater part of the light trapped within the emissive stack 604 may diverge and propagate through the second bank portion 612 of the dual bank structure to reach a greater part of the first bank portion 611 and be reflected in the on-axis direction. Furthermore, the example light emitting structure 600A may have any one of the multiple layers within the emissive stack 604 except for the emissive layer extending over at least a portion of the bank 612. Moreover, the example light emitting structure 600A having the at least one microlens 614 may allow even more light collimated in the on-axis direction. In one or more implementations of the present disclosure, the at least one microlens 614 in the example light emitting structure 600A may be a replacement or an addition to the concave surface 511a of the first bank portion 511 in the example light emitting structure 500A of FIG. 5A to allow more light collimated in the on-axis direction. As such, light extraction may be improved, and the extracted light may be collimated to improve efficiency, resulting in a higher on-axis brightness for a display.

Figure 7A:
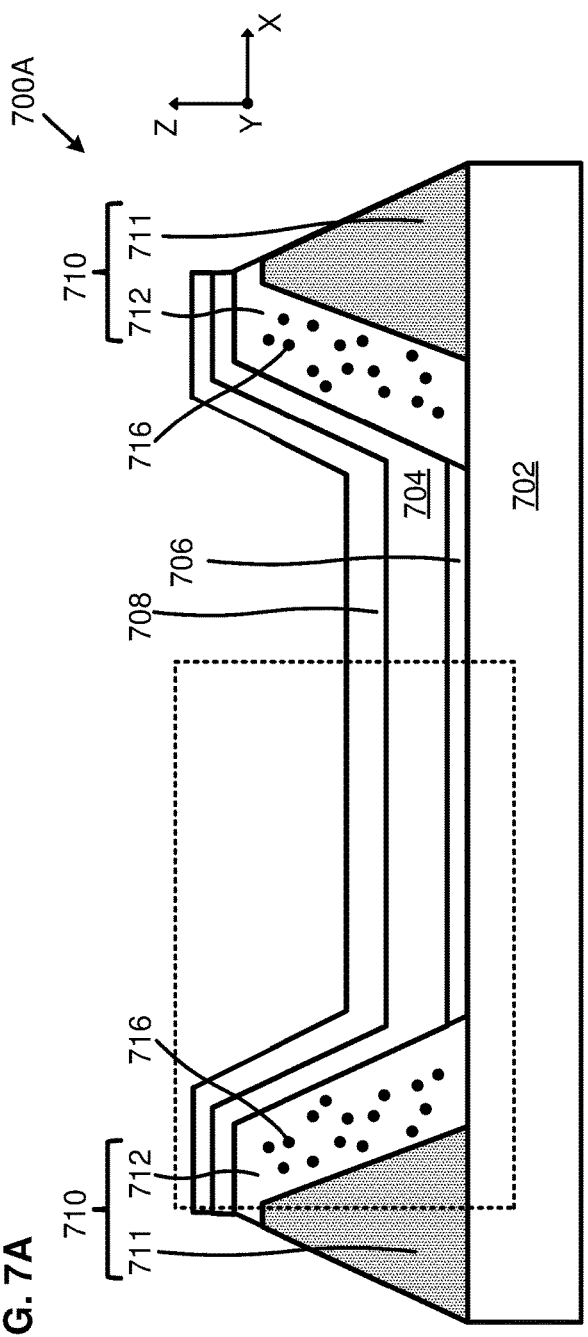
FIG. 7A is a schematic cross-sectional view of an example light emitting structure in accordance with an example implementation of the present disclosure.
Figure 7B:
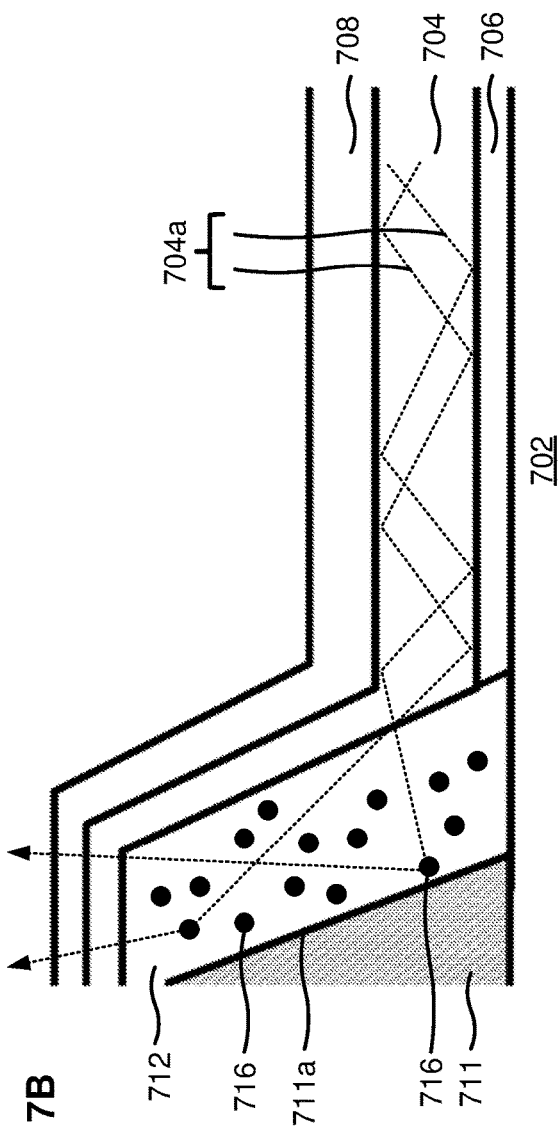
FIG. 7B is a partially enlarged view of the framed area in FIG. 7A in accordance with an example implementation of the present disclosure.

FIG. 7A is a schematic cross-sectional view of an example light emitting structure in accordance with an example implementation of the present disclosure. FIG. 7B is a partially enlarged view of the framed area in FIG. 7A in accordance with an example implementation of the present disclosure.

In FIG. 7A, the example light emitting structure 700A may be substantially similar to the example light emitting structure 400A in FIG. 4A. The example light emitting structure 700A in FIG. 7A may include a substrate 702, a first electrode layer 706 on the substrate 702, an emissive stack 704 on the first electrode layer 706, and a second electrode layer 708 on the emissive stack 704. The light emitting structure 700A may also include a bank 710 surrounding the first electrode layer 706 and the emissive stack 704 to form an interior space above the sub-pixel stack (e.g., the first electrode layer 706, emissive stack 704, and second electrode layer 708). The second electrode layer 708 may extend over a portion of the bank 710. In one implementation of the present disclosure, the second electrode layer 708 may extend to cover the entire bank 710. In one or more implementations of the present disclosure, the emissive stack 704, the first electrode layer 706, and the second electrode layer 708 may be a sub-pixel stack on the substrate 702, and the emissive stack 704 may include an emissive layer between an HTL layer and a ETL layer (not explicitly shown) as described in the disclosure.

In one or more implementations of the present disclosure, the bank 710 may include a first bank portion 711 and a second bank portion 712 (e.g., dual bank structure). The second bank portion 712 may be located between the first bank portion 711 and the emissive stack 704 to provide a separating distance between the first bank portion 711 and the emissive stack 704. In one of more implementations of the present disclosure, the bank 710 may be greater in thickness (e.g., along the z-direction, as indicated in FIG. 7A) than the thickness of the emissive stack 704. In one or more implementation, the bank 710 may have a thickness of half a micron or greater. In one implementation, the bank 710 may have a thickness of 2-3 microns. In one or more implementations, the first bank portion 711 may be opaque and may include at least one of light-scattering material and light-reflective material, and the second bank portion 712 may be transparent, semi-transparent, or a combination thereof. In one implementation, the light-scattering material or the light-reflective material may be silver.

The example light emitting structure 700A in FIG. 7A of the present disclosure may differ from the example light emitting structure 400A in FIG. 4A in that the example light emitting structure 700A may include the second bank portion 712 having a plurality of particles 716 scattered in the second bank portion 712. The example light emitting structure 700A may still include the emissive stack 704 extending over at least a portion of the bank 710. In one preferred implementation, any one of the multiple layers (e.g., HTL layer, ETL layer, etc.) within the emissive stack 704 except for the emissive layer may extend over at least a portion of the bank 712. In one or more implementations, any one of the multiple layers within the emissive stack 704 except for the emissive layer may extend over the first bank portion 711 and the second bank portion 712.

FIG. 7B is a partially enlarged view of the framed area in FIG. 7A in accordance with an example implementation of the present disclosure. In FIG. 7B, the first bank portion 711 may include at least one surface 711a at an angle with respect to an axis substantially normal to a top surface of the emissive stack 704. The second bank portion 712 may be located between the first bank portion 711 and the emissive stack 704 to provide a separating distance between the first bank portion 711 and the emissive stack 704. The separating distance may allow a portion of light emissions 704a emitted from the emissive stack 704 and trapped in the emissive stack 704 by the first electrode layer 706 and the second electrode layer 708 to propagate within the emissive stack 704 over a course of a few microns. The trapped light emissions 704a may further diverge within the second bank portion 712, propagate to the plurality of particles 716 of the second bank portion 712, and be reflected at an off-axis direction, which is a direction at an angle to an on-axis direction substantially normal to the top surface of the emissive stack 704. The plurality of particles 716 may provide improved light extraction from the emissive stack 704.

With the light emitting structure 700A including the dual bank structure, which has the first bank portion 711 (e.g., an opaque and reflective portion) and the second bank portion 712 (e.g., a transparent portion) between the first bank portion 711 and the emissive stack 704, a greater part of the light trapped within the emissive stack 704 may diverge and propagate through the second bank portion 712 of the dual bank structure to reach a greater part of the first bank portion 711 for improved light extraction. Furthermore, the example light emitting structure 700A may have any one of the multiple layers within the emissive stack 704 except for the emissive layer extending over at least a portion of the bank 712. Moreover, the example light emitting structure 700A having the plurality of particles 716 in the second bank portion 712 may allow even more trapped light to be extracted. As such, light extraction may be improved for a display.

From the present disclosure, it can be seen that various techniques may be used for implementing the concepts described in the present disclosure without departing from the scope of those concepts. While the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present disclosure is not limited to the particular implementations described but rather many rearrangements, modifications, and substitutions are possible without departing from the scope of the present disclosure.

What is claimed is:

1. A light-emitting structure comprising:
a substrate;
a sub-pixel stack over a surface of the substrate, the sub-pixel stack comprising:
an emissive stack including an emissive layer between a first transport layer and a second transport layer;
a first electrode layer coupled to the first transport layer; and
a second electrode layer coupled to the second transport layer; and
a bank comprising a first bank portion and a second bank portion, the second bank portion between the first bank portion and the sub-pixel stack, and the bank surrounding at least the emissive stack and the first electrode layer forming an interior space above the sub-pixel stack, wherein:
the second bank portion separates the first bank portion from the emissive stack such that a portion of light emissions from the emissive stack diverges by the second bank portion and is directed onto at least one surface of the first bank portion;
the first bank portion is opaque and comprises one of light-scattering material and light-reflective material, and the second bank portion is one of transparent and semi-transparent;
the second bank portion comprises a plurality of particles scattered in the second bank portion;
the diverged light emissions propagate to the plurality of particles of the second bank portion; and
at least some of the diverged light emissions are reflected along an off axis direction at an angle to an on-axis direction which is normal to a top surface of the emissive stack.

2. The light-emitting structure of claim 1, wherein the at least one surface of the first bank portion is at an angle to an axis normal to the top surface of the emissive stack.

3. The light-emitting structure of claim 2, wherein the diverged light emissions are reflected by the at least one surface of the first bank portion along the on-axis direction.

4. The light-emitting structure of claim 3, wherein the bank has a thickness greater than a thickness of the emissive stack.

5. The light-emitting structure of claim 3, wherein at least one layer of the emissive stack except for the emissive layer extends to cover at least a portion of the bank.

6. The light-emitting structure of claim 1, wherein:
the emissive layer includes one of a quantum dot emission material and an organic electroluminescent dye;
the first transport layer includes a hole transport layer;
the second transport layer includes an electron transport layer;
the first electrode layer is an anode layer including a metallic reflector for reflecting light emitted from the emissive layer; and
the second electrode layer is a cathode layer including a transparent material.

7. The light-emitting structure of claim 1, wherein:
the emissive layer includes one of a quantum dot emission material and an organic electroluminescent dye;
the first transport layer includes an electron transport layer;
the second transport layer includes a hole transport layer;
the first electrode layer is a cathode layer having a metallic reflector for reflecting light emitted from the emissive layer; and
the second electrode layer is an anode layer having a transparent material.

8. A light-emitting structure comprising:
a substrate;
a sub-pixel stack over a surface of the substrate, the sub-pixel stack comprising:
an emissive stack including an emissive layer between a first transport layer and a second transport layer;
a first electrode layer coupled to the first transport layer; and
a second electrode layer coupled to the second transport layer; and
a bank comprising a first bank portion and a second bank portion, the second bank portion between the first bank portion and the sub-pixel stack, and the bank surrounding at least the emissive stack and the first electrode layer forming an interior space above the sub-pixel stack, wherein:
the second bank portion separates the first bank portion from the emissive stack such that a portion of light emissions from the emissive stack diverges by the second bank portion and is directed onto at least one surface of the first bank portion;
the first bank portion is opaque and comprises one of light-scattering material and light-reflective material, and the second bank portion is one of transparent and semi-transparent;
the at least one surface of the first bank portion is at an angle to an axis normal to a top surface of the emissive stack;
the diverged light emissions are reflected by the at least one surface of the first bank portion along an on-axis direction normal to the top surface of the emissive stack; and
the at least one surface of the first bank portion comprises a concave surface.

9. The light-emitting structure of claim 8, wherein the concave surface has a focal length being a distance between the first bank portion and an edge of the emissive stack.

10. The light-emitting structure of claim 8, wherein the bank has a thickness greater than a thickness of the emissive stack.

11. The light-emitting structure of claim 8, wherein:
the emissive layer includes one of a quantum dot emission material and an organic electroluminescent dye;
the first transport layer includes a hole transport layer;
the second transport layer includes an electron transport layer;
the first electrode layer is an anode layer including a metallic reflector for reflecting light emitted from the emissive layer; and
the second electrode layer is a cathode layer including a transparent material.

12. The light-emitting structure of claim 8, wherein:
the emissive layer includes one of a quantum dot emission material and an organic electroluminescent dye;
the first transport layer includes an electron transport layer;
the second transport layer includes a hole transport layer;

the first electrode layer is a cathode layer having a metallic reflector for reflecting light emitted from the emissive layer; and the second electrode layer is an anode layer having a transparent material.

13. A light-emitting structure comprising:

a substrate;

a sub-pixel stack emitting at least one of a plurality of colours over a surface of the substrate, the sub-pixel stack comprising:

an emissive stack including an emissive layer between a first transport layer and a second transport layer;

a first electrode layer coupled to the first transport layer; and a second electrode layer coupled to the second transport layer; and a bank comprising a first bank portion and a second bank portion, the second bank portion between the first bank portion and the sub-pixel stack, and the bank surrounding at least the emissive stack and the first electrode layer forming an interior space above the sub-pixel stack wherein:

the second bank portion separates the first bank portion from the emissive stack such that a portion of light emissions from the emissive stack diverges by the second bank portion and is directed onto at least one surface of the first bank portion;

the first bank portion is opaque and comprises one of light scattering material and light reflective material, and the second bank portion is one of transparent and semi-transparent;

the at least one surface of the first bank portion is at an angle to an axis normal to a top surface of the emissive stack;

the diverged light emissions are reflected by the at least one surface of the first bank portion along an on-axis direction normal to the top surface of the emissive stack; and the light-emitting structure further comprises at least one of:

the first electrode layer extending through the second bank portion to the first bank portion, and the first bank portion surrounding the first electrode layer and the emissive stack;

at least one layer of the emissive stack except for the emissive layer extending to cover at least a portion of the bank; and the at least one surface of the first bank portion comprising a concave surface.

* * * * *